United States Patent [19]

Christiansen et al.

[11] 3,732,507

[45] May 8, 1973

[54] AC POWER SUPPLY HAVING COMPUTER CONTROLLED FREQUENCY AND PHASE AND AMPLITUDE

[75] Inventors: Robert A. Christiansen; Dhanikodi Balasubramaniam, both of San Diego, Calif.

[73] Assignee: California Instruments Co., a Division of Aiken Industries, Inc., San Diego, Calif.

[22] Filed: Oct. 18, 1971

[21] Appl. No.: 190,246

[52] U.S. Cl. ....................332/16 R, 332/17, 332/31 R, 340/347 DA

[51] Int. Cl. ....................H03c 3/02

[58] Field of Search ....................332/16 R, 16 T, 31 R, 332/31 T, 17; 340/347 DA

[56] References Cited

UNITED STATES PATENTS

| | | | |
|---|---|---|---|
| 3,160,812 | 12/1964 | Scantlin | 332/17 X |
| 3,054,073 | 9/1962 | Powers | 332/17 |
| 3,588,530 | 6/1971 | Langan | 340/347 DA |
| 3,320,409 | 5/1967 | Larrowe | 340/347 DA X |
| 3,546,603 | 12/1970 | Lenz | 332/16 X |

*Primary Examiner*—Alfred L. Brody
*Attorney*—Brown & Martin

[57] ABSTRACT

An AC power supply for supplying single phase or multiple phase AC power with frequency, phase, and amplitude accurately programmed by digital computer command. The power supply utilizes a controlled pair of signals having a constant phase difference for all programmed frequencies, which are restructured to provide a programmed phase signal independent of the frequency by utilizing this input phase difference. The signals are increased or decreased in amplitude by an amplitude programmer that utilizes both a feedback signal from the load and a programmable forward gain amplifier to provide a rapid and controlled programmed amplitude output of the load. The power supply also utilizes a fast range changing circuit which allows the power supply to select frequency quickly in decade steps.

19 Claims, 10 Drawing Figures

INVENTORS
ROBERT A. CHRISTIANSEN
DHANIKODI BALASUBRAMANIAN
BY
Brown & Martin
ATTORNEYS INVENTORS
ROBERT A. CHRISTIANSEN
DHANIKODI BALASUBRAMANIAN
BY
Brown & Martin
ATTORNEYS INVENTORS
ROBERT A. CHRISTIANSEN
DHANIKODI BALASUBRAMANIAN
BY
Brown & Martin
ATTORNEYS INVENTORS
ROBERT A. CHRISTIANSEN
DHANIKODI BALASUBRAMANIAN
BY
Brown & Martin
ATTORNEYS INVENTORS
ROBERT A. CHRISTIANSEN
DHANIKODI BALASUBRAMANIAN
BY
Brown & Martin
ATTORNEYS

AC POWER SUPPLY HAVING COMPUTER CONTROLLED FREQUENCY AND PHASE AND AMPLITUDE

BACKGROUND OF THE INVENTION

Digital computer programmed power supplies are often used for simulating AC power systems or communication systems of generally large power and low frequency and in testing avionic packages, motors, transformers and generally as a part of automatic test equipment. So it is desirable to have a system for providing AC power, either single phase, two phase, three phase or any multiple phase, that provides power signals having simultaneously controlled frequency, phase and amplitude and with a fast and precise resolution over a wide range of frequencies, phases and amplitudes, that are set independently from the other with large power output, and which system synthesizes the precise frequency, phase and amplitude under programmed command from a digital computer.

SUMMARY OF THE INVENTION

In an embodiment of this invention an original signal is synthesized by an oscillator that provides a wide range of frequency outputs in the form of two signals, having a given spaced phase therebetween that is constant for all frequencies. The spaced phase signals are restructured by utilizing the constant spaced phase relationship through adding, inverting and amplifying to provide a programmed controlled phase output signal that is independent of the programmed frequency, and which output phase is programmed separately for each digit to a given base number. The phase programmed output signal is then programmed in amplitude and fed to a load. The AC output signal applied to the load is then detected through a feedback error signal control circuit to check and adjust the programmed output AC voltage. Thus the circuit provides a synthesized AC output voltage of a single phase or multiple phase that is simultaneously set by computer program command to a given precise frequency, phase and amplitude. The frequency, phase and amplitude are independent of each other. The system further provides a precise control over a wide range of phase shifts, frequencies and amplitudes by separate fast reacting amplitude and range change circuits.

The frequency of the oscillator output is controlled by command signals from the computer that electrically insert resistances into and out of the oscillator circuit. Thus the oscillator reacts quickly to programmed changes in frequency since energy storage elements are not changed in order to change the frequency inside of a given decade range. The major changes in frequencies are accomplished by computer controlled capacitor banks. To accomplish the capacitor switching in a rapid manner, a circuit is provided that injects current at the optimum time into the capacitor's so that they are rapidly charged, thus providing a rapid stabilization of the oscillator to the new frequency. A series of phase shift generator circuits process the phase spaced input signals through the insertion of resistances into the phase shift generator circuits, to provide an accurate phase controlled output signal that is independent of the programmed frequency. The amplitude control circuits utilize a feedback circuit that is isolated from the load to eliminate ground loop current from flowing back into the programmable power supply and back into the digital computer. The amplitude circuit employs a modulator responsive to a programmed error signal generator in the servo feedback loop, that amplitude modulates the frequency and phase programmed input signal to accurately provide the desired programmed amplitude output to the load. A programmed amplifier provides the input signal to the modulator in proportion to the desired output voltage. The servo loop is only required to detect small variations in the programmed voltage output, therefore a modulator which has a small dynamic range but excellent amplitude linearity can be used, thus reducing distortion. Also this provides means for protection against shorted loads and accidental opening of the servo loop. The limited dynamic range of the modulator acts so as to limit the maximum value of the output voltage to the external load, should an accidental opening of the servo loop occur.

Thus the invention provides a synthesized AC signal having precisely controlled and accurately known frequency, phase and amplitude that is programmed by command from a digital computer or other control means to provide quick, accurate and precise changes in frequency, phase and amplitude independently.

It is therefore an object of this invention to provide a new and improved AC power supply that provides a digital logic controlled frequency, phase and amplitude output.

It is another object of this invention to provide a new and improved AC power supply that provides controlled frequency, phase and amplitude output signals of single phase or multiple phase, in which the frequency or phase or amplitude can be selectively set independently of the other.

It is another object of this invention to provide a new and improved programmable AC power supply utilizing a pair of oscillator output signals having a constant spaced phase, with the frequency being rapidly changeable without effecting the constant phase spacing.

It is another object of this invention to utilize a pair of constant phase spaced signals having any fixed phase spacing except 0° or 180° to synthesize a phase spaced signal, or signals, which can be programmed by a digital computer or by other digital logic signals.

It is another object of this invention to provide a new and improved digital computer programmable AC power supply utilizing a programmable gain amplifier prior to the modulator as well as a programmable gain amplifier in the error signal feedback loop, which programmable gain amplifier prior to the modulator acts so as to perform four critical functions, namely, to reduce the required dynamic range of the modulator to a small percentage range of the signal at the input to the modulator thereby limiting the output voltage of the programmable AC power supply should the error signal feedback loop accidently open and inadvertently cause the modulator to apply unprogrammed full power to the load; to reduce the required dynamic range of the modulator to a small percentage range of the signal at the input to the modulator thereby improving the linearity of the modulator thus reducing the distortion in the output signal of the programmable AC power source; to reduce the required dynamic range of the modulator to a small constant percentage range of the signal at the input to the modulator thereby improving the accuracy of the programmed output signal especially at a low percentage of the full scale output voltage; to maintain the same design center bias on the error input to the modulator independent of the digital computer programmed output amplitude thereby providing improved setting time of the AC power supply when a new amplitude is programmed by the digital logic signals.

It is another object of this invention to provide a new and improved AC power supply having a power amplifying circuit with a voltage adjusting feedback loop that is isolated from the load by means of precision signal transformers which eliminate ground currents in the load circuit from flowing back into the internal ground circuits of the programmable power supply or back into the digital computer itself.

Other objects and many advantages of this invention will become more apparent upon a reading of the following detailed description and an examination of the drawings, wherein like reference numerals designate like parts throughout and in which.

Figure 8:
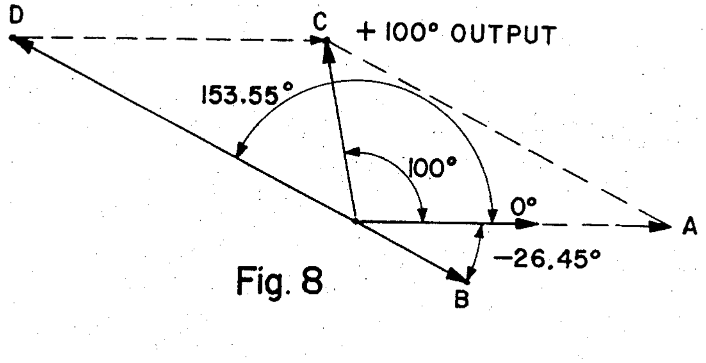

FIG. 8 is a vector diagram illustrating the structuring of a plus 100° phase spaced signal from 0° and minus 26.45° outputs of the wien bridge oscillator.

Figure 9:
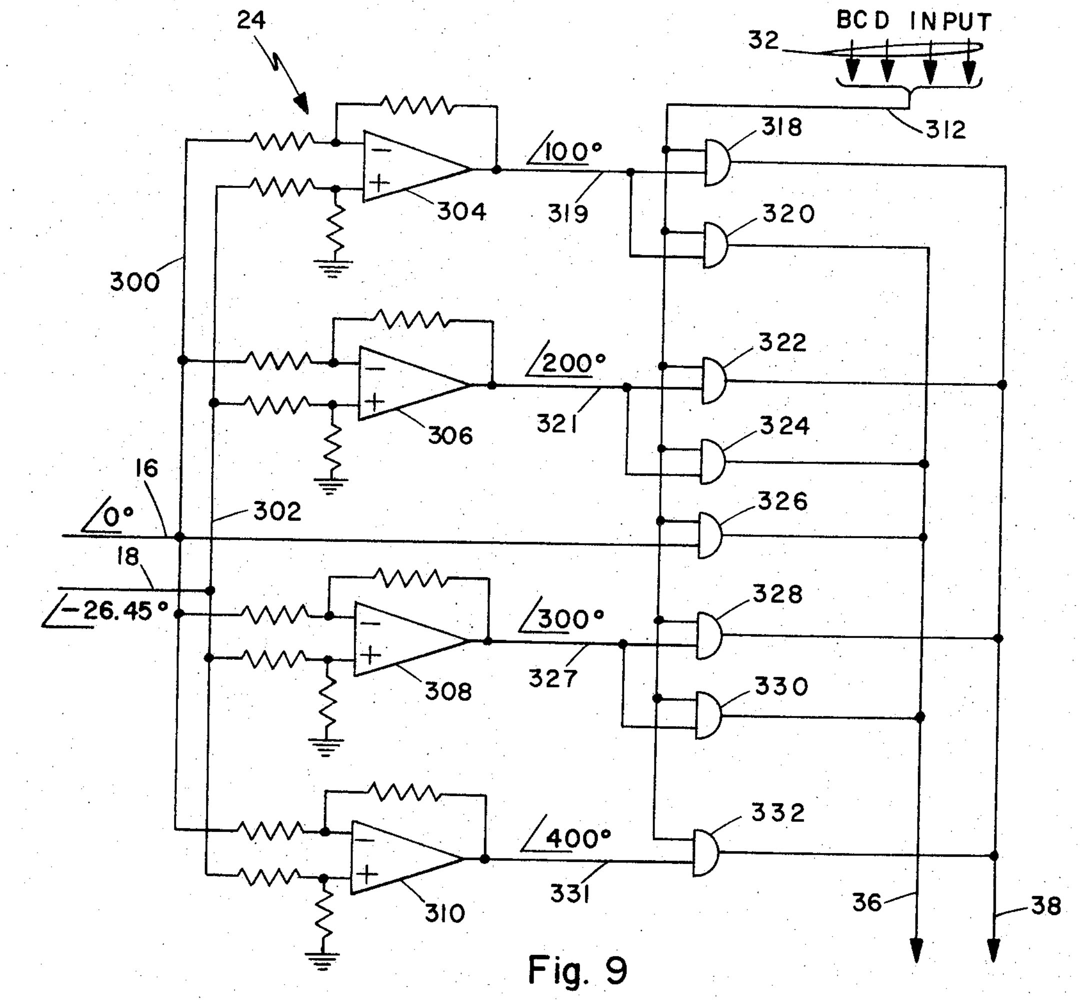

FIG. 9 is a block and schematic diagram of the 0°/100°°/300°/400° phase shift generator.

Figure 10:
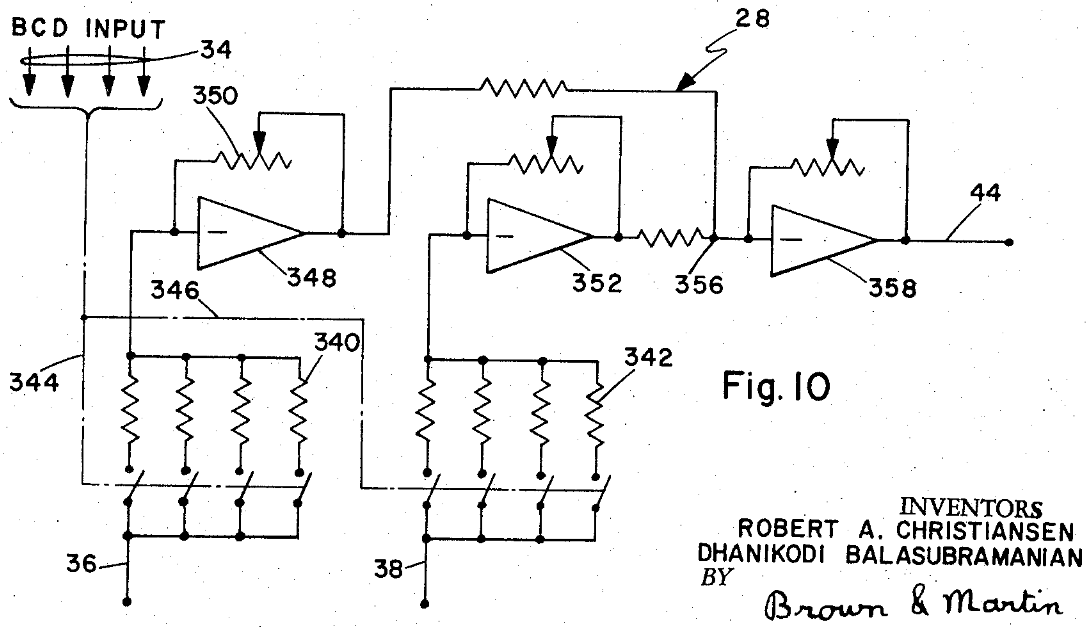

FIG. 10 is a block and schematic diagram of the 0° through 90° phase shift generator.

Figure 1:
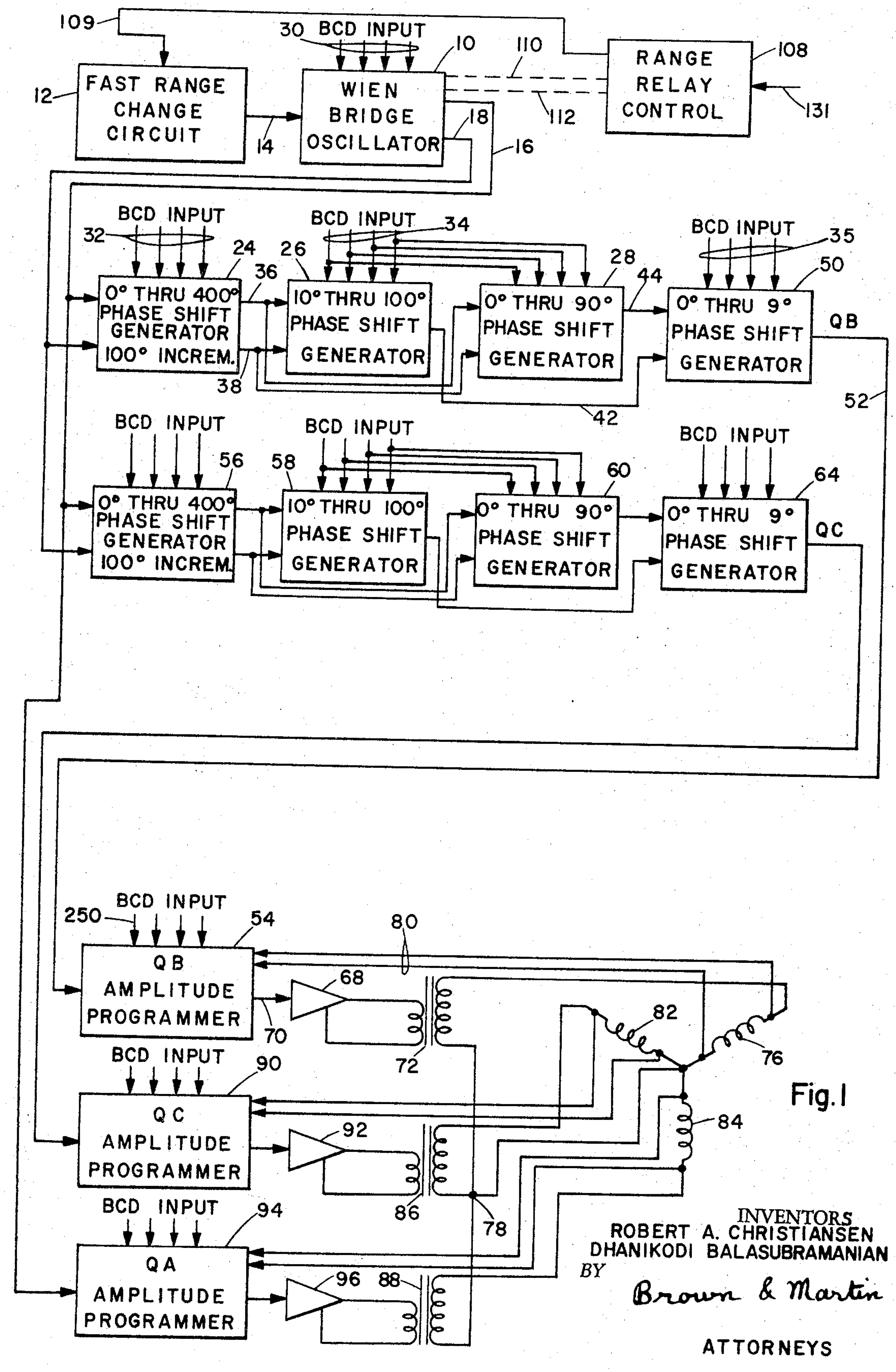
FIG. 1 is a block and schematic diagram of an embodiment of this invention.

Referring to the drawings, there is illustrated in FIG. 1 an embodiment of a programmable AC power supply that provides digital logic controlled three phase AC voltage to a wye connected load. The input control signals are binary coded decimal input information. While this embodiment employs binary coded decimal information, it should be recognized that the system can use straight binary, octal, ten line decimal or other number system operation. Also while this system is illustrated with a three phase AC voltage output, and thus requires only two channels of programmable phase to control phases, QA, QB and QC, a single phase AC output or other multiple phase output can be provided. The number of phase generators is always equal to the number of independent slave phase outputs required. While this embodiment employs two output signals from a wien bridge oscillator at an angle of 26.45° with respect to each other, it should be recognized that the system can use any other type of oscillator that provides two output signals that are spaced at any angle except 0° and 180°. For example, phase shift oscillators, with 90° quadrature outputs or 120° outputs would be acceptable and would exhibit some advantages over this embodiment in the area of improved phase accuracy.

A wien bridge oscillator 10 generates a programmed controlled output frequency to output lines 16 and 18 in response to digital logic input signals through input lines 30. The signals in lines 16 and 18 have the same frequency with the signal in line 16 considered to have a 0° reference phase angle. The signal in line 18 has a phase of −26.45° with respect to the signal in line 16. This characteristic is inherent in the wien bridge oscillator output. It is necessary, as will be more apparent hereinafter, that the oscillator 10 provide two output signals separated by a given phase, that are not spaced 0° or 180° apart.

Figures 2, 3:
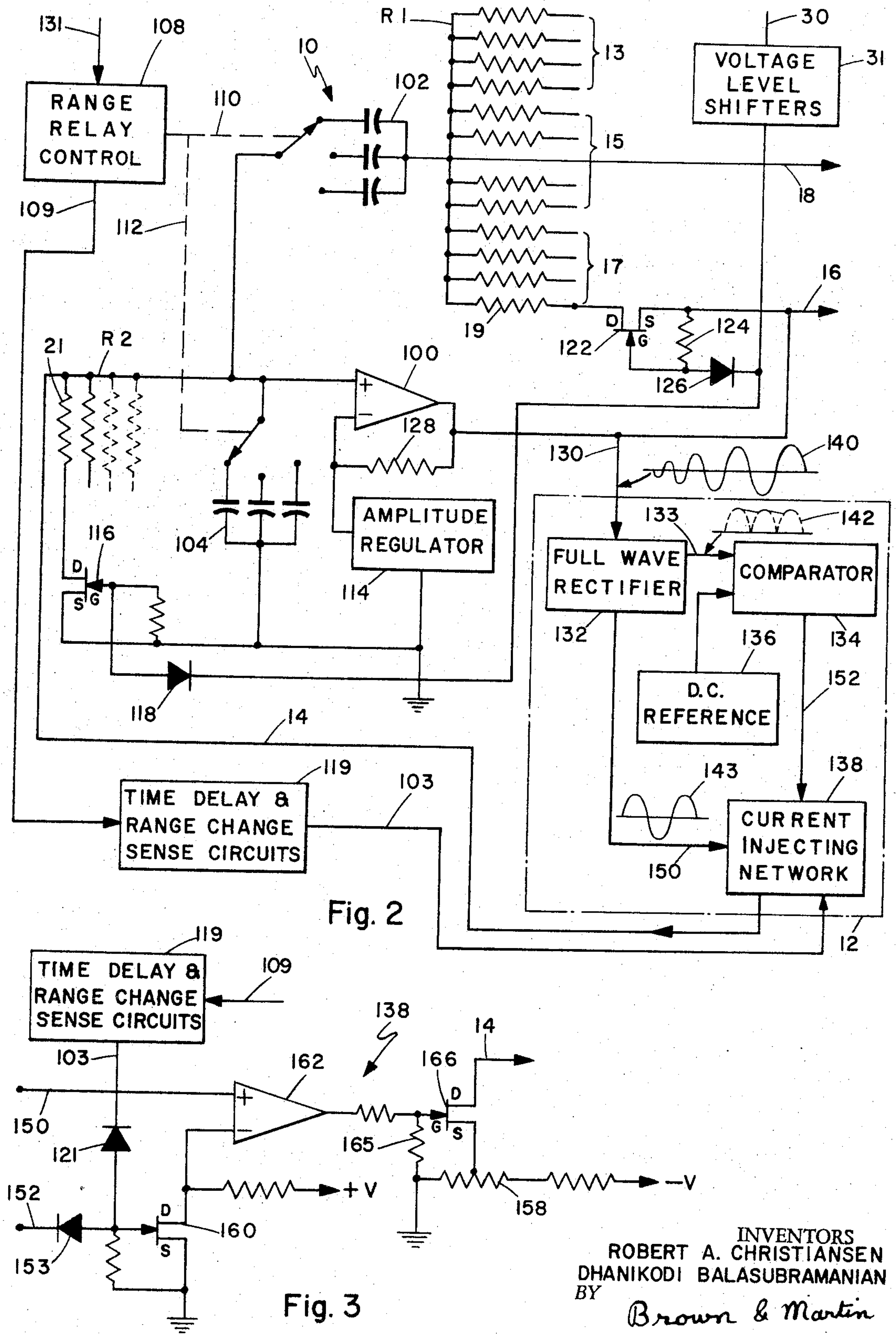
FIG. 2 is a block and schematic diagram of the fast range change circuit and wien bridge oscillator of FIG. 1.
FIG. 3 is a schematic diagram of the current injecting network in FIG. 2.

Referring to FIG. 2, the wien bridge oscillator 10 has an operational amplifier 100 with a feedback resistance circuit 128. The amplifier 100 provides an output signal to lines 16 and 18 at a frequency determined by the total conductance of resistance groups R1 and R2 and the particular capacitors of the capacitor circuits 102 and 104 that have been switched into the circuit. The individual resistances of resistance banks R1 and R2 are switched into the circuit by the digital logic inputs in lines 30. The capacitor circuits 102 and 104 are switched into the circuit by separate digital control lines 131 via the range relay control 108.

To change the frequency output in lines 16 and 18 by the digital logic inputs in lines 30, each of the individual resistors of $R_1$ and $R_2$ are controlled by an electronic switch, utilizing field effect transistors. A set of digital logic levels is fed through lines 30 to a set of voltage level shifters 31 such that each of the lines in line 30 drives a separate level shifter in the voltage level shifters 31. The function of the level shifter is to transform the BCD logic input signals into digital signals whose voltage level is compatable with the internal voltage levels of the programmable AC power supply. In this embodiment, the level shifter functions so as to convert $T^2L$ logic levels, 0 and plus 5 volts, into minus 15 volts and plus 15 volts, respectively. When the output level of the level shifter is minus 15 volts, then the FET 122 is non-conducting. However, when the output signal from the level shifter 31, as determined by the BCD input, is plus 15 volts, then FET 122 is zero biased via unidirectional device 126 that turns FET 122 on because there is zero gate-source voltage across resistor 124. This connects the particular resistance 19 of resistances $R_1$ into the circuit. The input level in line 120 through unidirectional device 118 turns on FET switch 116 to connect resistance 21 into the circuit. This changes the resistances of $R_1$ and $R_2$ in the circuit simultaneously and changes the frequency of the output signal of the wien bridge oscillator. For example, the four resistances of resistance groups 17 of $R_1$ may be weighted to represent 1, 2, 4 and 8 hertz, the group 15 being weighted to represent 10, 20, 40 and 80 hertz and the group 13 being weighted to represent 100, 200, 400 and 800 hertz, which in combination provide a decade frequency range with the required resolution.

The capacitors 102 and 104 may be similarly changed by digital logic inputs or through manual controls or other controls, such as the range relay control 108 that through lines 110 and 112 switch various sections of capacitors 102 and 104 into the circuit, normally in decade steps as controlled by digital inputs in lines 131. When the frequency is changed by switching resistors $R_1$ and $R_2$, the frequency output of the oscillator is changed almost instantaneously. However when changes of frequency are accomplished by switching the capacitors 102 and 104, then the circuit takes time to build back up to the set output voltage due to the new energy storage requirements of the capacitors 102 and 104. Accordingly capacitors 102 and 104 are only used to switch in the greater frequency ranges, and resistances $R_1$ and $R_2$ are used to provide the intermediate frequency range changes. The fast range change circuit 12, sense when a change in the capacitors 102 and 104 are made in the circuit, and functions to provide an input current into line 14, that speeds up the stabilizing of the amplitude and frequency of the oscillator 10 at the given programmed frequency.

When capacitors 102 and 104 are switched in and out of the wien bridge oscillator circuit to change the frequency range, the sinusoidal output of the oscillator may momentarily drop to zero or otherwise experience a severe transient before slowly building back up to the original sinusoidal level output. This will occur because the voltage on the particular capacitors switched into the circuit are not identical to the voltage across the previous capacitors in the circuit at the instant of the switching action. The rate in which this output builds back up to the original output is dependent upon the maximum excess gain which is available from the amplitude regulator 114, and in very low distortion oscillators, such as oscillator 10, it is necessary to minimize the amount of this excess gain which results in an oscillator with poor transient characteristics when capacitors 102 and 104 are changed in value. As a result, the output of the amplifier 100 in output line 16 starts to build up slowly as shown in waveform 140. Thus the output, which is instantaneously at a more negative level than the non-inverting input, has to drive the capacitors 102 and 104 to the proper voltage levels. But the only extra current available at the non-inverting input is the minute offset current of the operational amplifier 100 and the relatively small current through capacitor 102 as delivered from the output of amplifier 100. So without the required current, the output envelope of the amplifier 100 and oscillator 10 slowly builds up as the oscillator regeneration takes place. The function of the fast change circuit is to supply the required current to the non-inverting input to the amplifier 100, through a means other than the output of the oscillator.

The fast range change circuit 12 senses the output of the amplifier 100 through line 130 and feeds this signal to a precision rectifier circuit 132. The filtered full wave rectifier output in line 133 provides a voltage to the comparator as shown in waveform 142. Line 150 provides an inverted output whose gain is semi-infinite for small signals and −1.0 for normal full scale signals as shown in waveform 143. This signal is provided to the current injecting network 138 through line 150. At any time, when the oscillator steady rate sinusoidal output goes down below a fixed reference value, such as due to switching of capacitors 102 and 104, the DC reference voltage 136 causes the comparator 134 output in line 152 to generate positive pulses whenever the instantaneous value of the signal on line 133 is more negative than the DC reference 136. Referring to FIG. 3, the comparator output is fed through line 152 and through unidirectional device 153. This reverse biases diode 153 and drives the FET 160 to saturation, which in turn provides a zero volt bias on the inverting input of amplifier 162 and allows the signal in line 150 to be amplified and transmitted through amplifier 162 without phase inversion. When the oscillator tries to build up in the negative direction, amplifier 162 delivers a one-half wave positive going pulse which allows FET 166 to inject current from the voltage divider 158 into the non-inverting input to amplifier 100 through line 14 at the correct time. This causes the oscillator to build up its desired output rapidly. As soon as the output of the oscillator reaches the reference level as set by the DC reference voltage 136, the current injecting network is turned off. The value of the reference voltage 136 is set so as to provide the fastest response to a switching of capacitors 102 and 104 without causing ripple on line 133 from activating the comparator in an erroneous fashion. Voltage divider 158 is set to the peak value of the signal at the non-inverting input of 100 under normal operating conditions. The current injecting network is enabled to function only by a change in the digital logic signals in lines 109 via time delay multivibrator 119, which apply +15 volts to the anode of unidirectional device 121 via line 103 and causes it to not conduct during and shortly after a range change.

Figure 7:
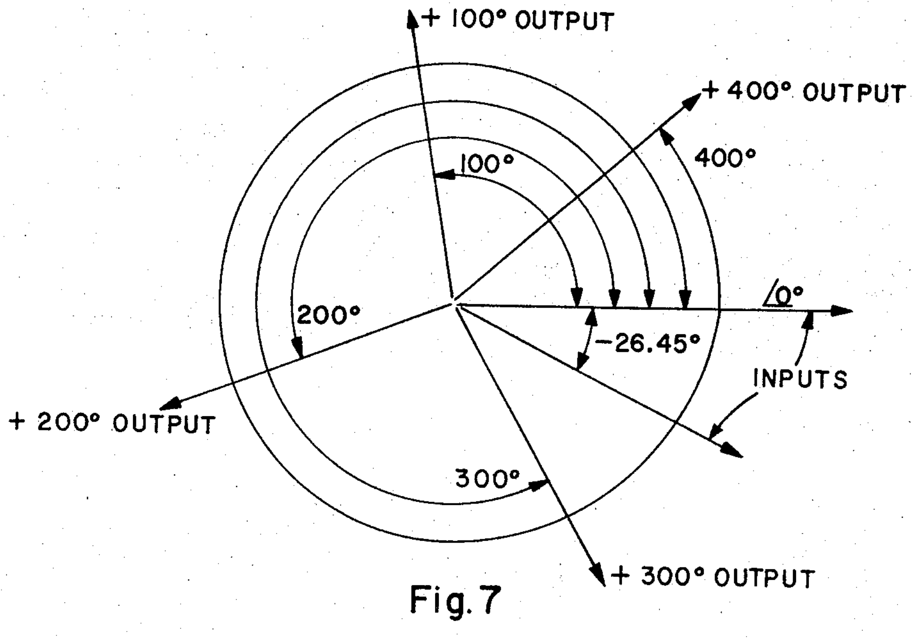
FIG. 7 is a vector diagram illustrating phase relationships of the input signals received by and the output signals from the 0°/100°/200°/300°/400° phase shift generator.

The wien bridge oscillator 10 supplies a sine wave voltage, in this illustrative embodiment, of 5 volts rms in line 16 and 3.73 volts rms in line 18 with the signal in line 18 being phase spaced from the signal in line 16 by minus 26.45°. This phase difference is constant for all programmed frequencies. The step generators 24, 26, 28 and 50, referring again to FIG. 1, are digital logic controlled through their BCD inputs 32, 34, and 35 to provide an output signal in line 52 that has a programmed phase shift in 1° increments from zero to 360°. The respective phase shift generators comprise groups of operational amplifiers, differential amplifiers, and adders, that restructure the vectors of the input phase spaced signals in line 16 and line 18 to obtain the desired correct phase of the output signal relative to the signal in line 16. The phase shift generator 24 has two outputs, line 36 and line 38, such that the phase of the output in line 38 is spaced +100° with respect to line 36 and that line 36 is spaced either 0°, +100°, +200° or +300° with respect to line 16. The angle of line 36 is equal to the value programmed by the BCD input in lines 32. FIG. 7 shows a vector diagram for the inputs to the phase shift generator 24 as well as the possible outputs from phase shift generator 24. FIG. 8 shows a vector diagram of the generation of the +100° output from phase shift generator 24. Signal B corresponds to the input voltage in line 18 which is inverted and amplified to provide the signal at D. The signal at D is added in a linear fashion to signal A which is scaled from that signal in line 16. This provides signal C which has a phase shift of +100° with respect to line 16. The scaling is accomplished in such a fashion as to maintain the same amplitude signal at C as was available in line 16, i.e. 5.0 volts rms in this embodiment. In similar manner, +200°, +300° and +400° signals are generated from the basic zero degree signal in line 16 and the −26.45° signal in line 18. The particular outputs selected for line 36 and line 38 are controlled by FET analog switches activated by the BCD control logic in the manner previously described relative to the resistance programming of the wien bridge oscillator 10.

To more particularly describe the circuit arrangement for accomplishing this, referring to FIG. 9, the signals in lines 16 and 18 are fed to lines 300 and 302 respectively. These lines are connected to operational amplifiers 304, 306, 308 and 310. These amplifiers provide phase spaced analog output signals on a preprogrammed and fixed amplitude output basis, 5 volts rms in this embodiment, to respective lines 319, 321, 327 and 331 that are phase spaced relative to the zero degree reference signal in line 16, which phase spacing is +100°, +200°, +300° and +400°. This is accomplished in the operational amplifiers by the combining of the two inputs from lines 16 and 18 to each amplifier as previously described relative to FIG. 8. The one hundred's weight BCD input in lines 32, as represented by lines 312, closes analog switches 318, 320, 322, 324, 326, 328, 330 and 332, two at a time, on the programmed basis, gating the correct phase spaced 5 volts rms outputs to lines 36 and 38. For example, for an output phase relationship between lines 36 and 38, of zero degrees and 100°, then analog switches 326 and 318 are closed. To obtain 100° and 200° phase spaced outputs in lines 36 and 38, then analog switches 320 and 322 are closed. For obtaining a signal with phase spaced outputs of 300° and 400° in lines 36 and 38, then the respective analog switches 330 and 332 are closed.

The phase shift generator 26, referring agin to FIG. 1, takes two input signals, line 36 and line 38, which are spaced 100° apart in this embodiment, and divides this spacing into 10 equal 10° spacings referenced to the signals in line 38 and line 38 such that the phase spacing in line 42 is advanced 10° from the digital computer controlled BCD input in line 34 and referenced to the phase spaced signal in line 36. For example, if lines 34 are programmed to 30° by digital logic control, then the phase in line 42 is spaced +40° relative to the phase in line 36. The phase in line 42 relative to that in line 16 can be expressed by the equation:

$$\phi_{42} = \phi_{36} + 10(\phi_{34}) + 10°$$

where

- $\phi_{42}$ is the spaced phase in line 42 relative to the spaced phase in line 16
- $\phi_{36}$ is the spaced phase in line 36 relative to the spaced phase in line 16
- $\phi_{34}$ is the digital logic controlled 10's weight decimal phase command.

The phase shift generator 28 takes two input signals, line 36 and line 38, which are spaced 100° apart, in this embodiment, and divides this phase spacing into ten equal 10° spacings referenced to line 36 and line 38 such that the phase spacing in line 44 is equal to that determined by a digital logic controlled input in line 34 and referenced to the phase spaced signal in line 36. For example, if line 34 is programmed to 30° by digital logic control, then the phase in line 44 is spaced +30° relative to the phase in line 36. The phase in line 44 relative to that in line 16 can be expressed by the equation:

$$\phi_{44} = \phi_{36} + 10(\phi_{34})$$

where

- $\phi_{44}$ is the spaced phase in line 44 relative to the spaced phase in line 16
- $\phi_{36}$ is the spaced phase in line 36 relative to the spaced phase in line 16
- $\phi_{34}$ is the digital logic controlled 10's weight decimal phase command.

The phase shift generator 50 takes two input signals, line 42 and line 44, which are phase spaced 10° apart, in this embodiment, and divides this phase spacing into 10 equal 1.0° increments referenced to line 44 and line 42 such that the phase spacing in line 52 is equal to that determined by a digital logic controlled input in line 35 and referenced to the phase spaced signal in line 44. For example, if line 35 is programmed to 7 degrees by digital logic control, then the phase spaced signal in line 52 is spaced plus 7 degrees relative to the phase in line 44. The phase in line 52 relative to that in line 16 is expressed by the equation:

$$\phi_{52} = \phi_{44} + \phi_{35}$$

where

- $\phi_{52}$ is the spaced phase in line 52 relative to the spaced phase in line 16
- $\phi_{44}$ is the spaced phase in line 44 relative to the spaced phase in line 16
- $\phi_{35}$ is the digital logic controlled unit's weight decimal phase command.

Combining the functions of the phase shift generators 24, 26, 28 and 50 and digital logic control lines 32, 34 and 35, the following equation is written:

$$\phi_{52} = 100\,\phi_{32} + 10\,\phi_{34} + \phi_{35}$$

where

- $\phi_{52}$ is the spaced phase in line 52 relative to the spaced phase in line 16
- $\phi_{32}$ is the digital logic controlled 100's weight phase command
- $\phi_{34}$ is the digital logic controlled 10's weight phase command
- $\phi_{35}$ is the digital logic controlled units weight phase command.

In an example of a circuit for accomplishing the phase shifting described above, phase shift generator 28 may comprise the circuit illustrated in FIG. 10. In operation, the inputs in lines 36 and 38 from the phase shift generator 24 are fed through resistance groups 340 and 342 to operational amplifiers 348 and 352. The output of the respective amplifiers 348 and 352 are determined by resistances selected, which are controlled by the BCD input signals through lines 34 and respective lines 344 and 346, via level shifters and FET switches similar to those previously described for resistance programming of frequency in the wien bridge oscillator 10. Amplifiers 348 and 352 provide predetermined fixed amplitude outputs for given resistances 340 and 342 inserted into the amplifier input. The amplifier outputs are linearly added at 356 and fed through amplifier 358 to line 44. The respective amplifiers 348 and 352 provide the required predetermined amplitude outputs with inversion, which signal is then inverted back by amplifier 358 and raised to the 5 volts rms output level. This provides the sum output with the correct phase spaced output in line 44. Phase generator 26 has a similar circuit to that illustrated in FIG. 10, and provides a phase shift output to line 42 that has a spaced phase of +10° with respect to that of line 44. The phase shift generator 50 has a similar circuit, only it is responsive to the BCD inputs 35 to provide the particular phase spaced output of 0° to 9° phase shift in 1° increments in line 52 in the manner previously described.

It should be understood from the foregoing description that the step generators 24, 26, 28 and 50 provide the programmed phase shift in 1° increments by in effect summing the digits on "base 10" to obtain the programmed phase shift. Thus, for example, for a phase shift of 183°, the "1" is programmed by the inputs in lines 32, the "8" is programmed by the input in lines 34, and the "3" is programmed by the inputs 35. So this circuit arrangement permits the separate programming of each digit. Other bases can be similarly used such as for example, base 7 or base 12. In the illustrated embodiment, the accuracy can be increased in the same manner to, for example, 0.1 by adding additional phase shift generators and an additional BCD input.

The output of the phase shift generator 50 again referring to FIG. 1, with the computer programmed frequency and phase shift is applied through line 52 to the amplitude programmer 54 for phase QB of the three phase voltage output. The amplitude programmer 54, in response to the digital logic input in lines 250, provides an output voltage to line 70 that when amplified by amplifier 68 and output transformer 72, provides the desired programmed voltage for phase QB of the three phase voltage output. For example, when the input voltage in line 70 is 5 volts rms, then the output of transformer 72 would be approximately 150 volts rms. Lines 80, connected across the load 76 (phase QB) senses the voltage supplied to load 76 and feeds this voltage back to the amplitude programmer 54 which provides feedback error control of the programmed voltage that is supplied by the secondary of output transformer 72 via amplifier 68. This provides improved line regulation, load regulation, amplitude stability and amplitude accuracy for the complete system. It is to be understood that the amplitude programmer 90, power amplifier 92, and output transformer 86 function in a similar manner to amplitude programmer 54, power amplifier 68 and output transformer 72 except these devices provide the phase C output to load 82. Also it is to be understood that the amplitude programmer 94, power amplifier 96, transformer 88 function in a similar manner to amplitude programmer 54, power amplifier 68 and output transformer 72 except these devices provide the phase A output to load 84.

Figure 4:
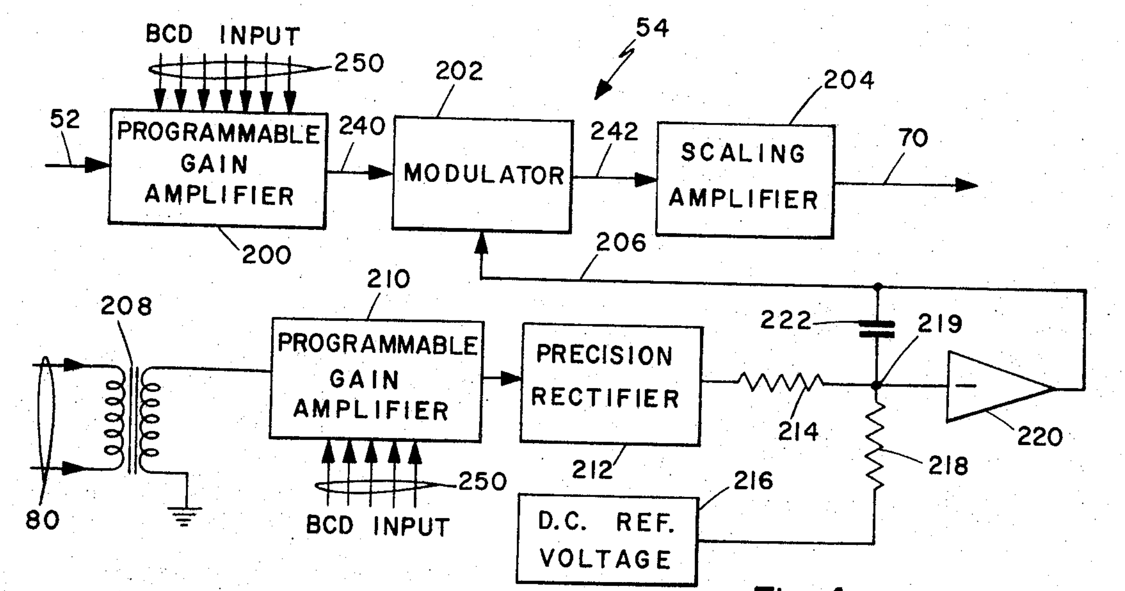
FIG. 4 is a block and schematic diagram of the amplitude programmer circuit and error correcting servo loop of FIG. 1.
Figure 5:
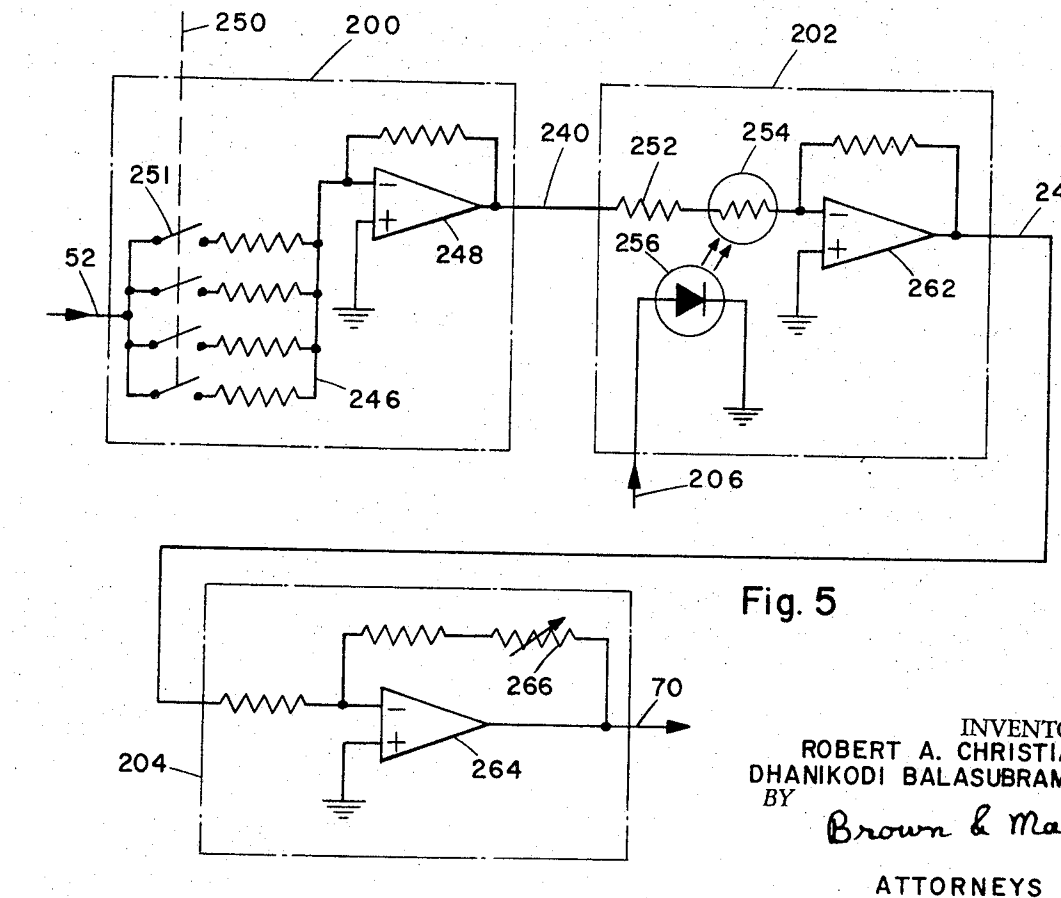
FIG. 5 is a schematic diagram of the forward loop programmable gain amplifier, modulator and scaling amplifier illustrated in FIG. 4.

Referring to FIG. 4, the amplitude programmer 54 receives the input voltage that for purposes of this example will be 5 volts rms, from line 52 that is fed to a programmable gain amplifier 200. The programmable gain amplifier comprises a high gain amplifier 248, see FIG. 5, whose gain is programmable by switching various input resistors 246 into the circuit under the control of the digital input lines 250. The resistance in resistor bank 246 may be controlled by switches 251 that are shown schematically for illustration, but are actually controlled by the digital logic control lines 250 in the manner previously described relative to the switching of resistances $R_1$ in FIG. 2 of the drawings. The output amplitude of the AC signal in line 240 is fed to a modulator 202 that supplies an output in line 242 which is of such a magnitude as to provide the precise amplitude across load 76, via scaling amplifier 204, power amplifier 68, and output transformer 72 as was programmed by the digital input in line 250. The output of the modulator 202 in line 242 is determined by two factors, the amplitude of the signal at line 240 and the gain of the modulator 202 as set by the signal in line 206. The signal in line 240 switches in the microsecond region upon receipt of a new command in lines 250 and provides a close approximation of the desired output of the modulator 202 in line 242. The gain of the modulator 202 is controlled by the servo feedback loop through line 206 and requires several milliseconds to respond. However the combination of both a fast response circuit and a slow response circuit gives an overall performance, which is very desirable for a programmable power source. The voltage in line 240 is fed through input resistors 252 and 254 to an operational amplifier 262. An error signal is fed from a circuit that derives the error signal from the load. This signal energizes a light emitting diode 256 that illuminates a photo sensitive resistance 254 in accordance with the current received from the input line 206. Thus the error signal as reflected in the current in line 206 is imparted to control the resistance of resistance 254 to the amplifier 262 that controls the output amplification of the amplifier 262 of the AC signal to line 242. Amplifier 264 is a scaling amplifier having a variable controlled resistance 266 in the feedback circuit. This variable resistance is used to set the maximum output of transformer 72 to 10 percent above the programmed output at or near full scale output (150 volts rms) when the transformer 208 is disconnected. In actual practice this may occur if the servo circuit 80 accidently opens or if the load 76 becomes shorted. In this embodiment the maximum output across 76 would be 165 volts (150 volts + 10 percent) which acts so as to protect the load if the servo circuit 80 should become disabled.

Figure 6:
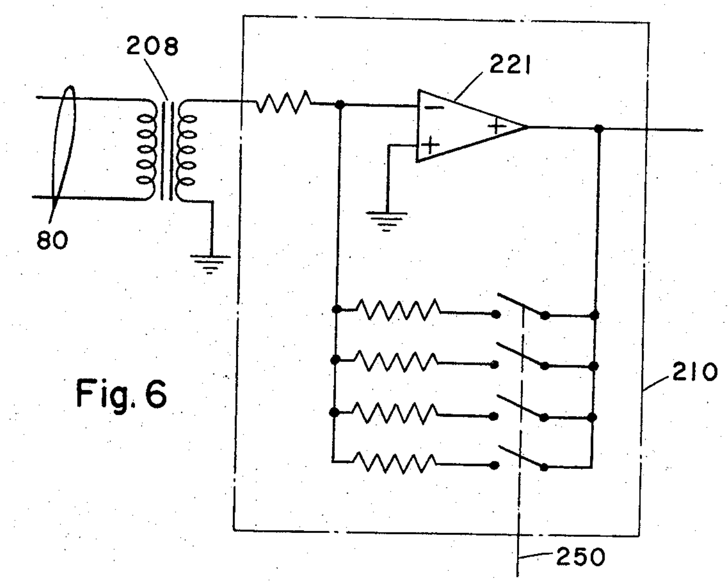
FIG. 6 is a schematic diagram of the isolation transformer and error correcting feedback loop programmable gain amplifier illustrated in FIG. 4.

Referring to FIGS. 4 and 6, the voltage in lines 80 is applied across a servo isolation transformer 208. The function of the servo transformer 208 is to remove ground loop currents in the neutral of the wye of the load from flowing back into the internal ground circuits of the computer controlled AC power supply. The servo transformer 208 is a wide band, precision, coupling transformer that has good linearity and flat frequency response and would normally have electrostatic and electromagnetic shielding. The transformer, in this embodiment, is a step down transformer that will step down the voltage received from lines 80 that will be in the order of, for example, 150 volts rms input to a 5 volt rms output. This 5 volt output is fed to a programmable gain amplifier 210 that is also programmed with digital controlled inputs in line 250. The programmable gain amplifier 210 functions to always provide a 5 volt rms input to the precision rectifier 212 independent of the output voltage across load 76. This is accomplished in the following fashion in this embodiment. The closed loop gain of the programmable gain amplifier 210 is given by the equation:

$$G_{210} = 150/V250$$

where $G_{210}$ is the closed loop voltage gain of the programmable gain amplifier 210

$V_{250}$ is the voltage value of digital controlled signals applied to lines 250.

If, for example, the digital controlled logic in lines 250 is programmed to 150 volts rms, then the voltage gain of amplifier 210 is 1.0 and the output of transformer 208 is 5.0 volts rms since the input of transformer 208 is 150 volts rms. This provides a 5 volt rms output from gain amplifier 210. If the digital controlled logic in lines 250 is programmed to 15 volts rms, then the voltage gain of amplifier 210 is 10 and the output of transformer 208 is only 0.5 volts rms, which also provides a 5.0 volt rms output from amplifier 210.

The precision rectifier 212, functions to rectify the signal received from the programmable gain amplifier 210 so that its voltage can be compared with a DC reference voltage 216 that is fed through resistor 218 to junction 219. The precision rectifier 212 provides precise full wave rectification of the output of programmable gain amplifier 210 with negligible errors and scales the signal so that a 5.0 volt rms input provides a 5.0 volt average output. The summing junction 219 to the operational amplifier 220 draws negligible input current, therefore the voltage out of the precision rectifier 212 discharges into the reference voltage source 216 that is a minus 10 volt dc reference voltage. The voltage at the summing junction 219 will be zero volts, since the resistance of resistor 218 is twice the resistance of resistor 214. Thus when 5.0 volts rms is supplied from the output of the programmable gain amplifier 210 to the precision rectifier 212, the output of the precision rectifier 212 will have an average value of 5 volts and the input junction 219 of the operational amplifier 200 will be at a null. At null, the output of amplifier 220 in line 206, will be a DC level which adjusts the output of the modulator 202 to provide precisely 150 volts rms across the load 76. The operational amplifier 220 is a very high gain amplifier that functions with capacitor 222 to eliminate most ripple from the output in line 206. A relatively large capacitor 222 is used for this purpose and causes the response time of the operational amplifier 220 to be relatively slow. Since this servo error loop has a small dynamic range, such as only plus or minus 10 percent of the programmed output voltage, and because the programmable gain amplifier 200 provides an instantaneous initial amplitude programming of the desired voltage to the modulator 202, the overall system provides a fast response time. Also this circuit, as previously described, provides protection against accidental openings of the servo loop. In some other circuit approaches, this type of failure can cause the output voltage to go to its maximum value and thereby damage the external load. However in this circuit, the output voltage can only increase by about 10 percent and thus no load damage will result. Also the system will program to very low voltages, such as 0.1 percent of maximum output voltage, without causing system instability or significant error. Still further protection against a shorted load at a low output voltage is provided since the dynamic range of the modulator is restricted. Also there is negligible transient undershoot or overshoot when the programmed amplitude is changed.

While the description has been the circuit for phase QB, it will be understood that phase shift generators 56, 58, 60 and 64 again referring to FIG. 1, will be programmed through their respective BCD inputs for providing a desired phase QC. The phase relationships of QA, QB, QC, can be programmed for a normal three phase output or for any desired phase output. Further the respective amplitude programmers 90 and 94 can be programmed to provide balanced voltages or unbalanced voltages.

While the circuit can operate without the fast range change circuit 12, this circuit reduces the response time to decade frequency shifts which may be very important in certain applications of computer programmed power supplies.

Having described our invention, we now claim:

1. A AC power supply comprising, signal generating means for providing at least two AC signals simultaneously having the same frequency that is selectively controlled with a constant phase difference between said signals for all frequencies, phase control means for combining said simultaneously generated pair of AC signals by utilizing said phase difference between said signals into an output signal having a phase independent of said frequency, and amplitude means for setting the amplitude of said output signal independent of the frequency and phase.

2. A programmable power supply as claimed in claim 1 in which, said signal generating means having frequency synthesizing means responsive to input signals for providing said AC signals with a selected frequency, and fast range change means for increasing the speed of response of said frequency synthesizing means in providing AC signals having a different frequency in response to changes in the input signals.

3. An AC power supply as claimed in claim 1 in which, said signal generating means comprising oscillator means for generating AC signals having a given constant phase difference therebetween, said oscillator means includes switch means for switching resistance and capacitance into said oscillator circuit and changing the frequency of said AC signals, and fast range change means for increasing the response time of said oscillator means when said capacitance is switched into said oscillator means.

4. A power supply as claimed in claim 3 in which, said oscillator means including an operational amplifier, and said fast range change means including means for injecting current into the input of said operational amplifier when said capacitance is switched.

5. A power supply as claimed in claim 4 in which, said fast range change means including means for detecting a decrease in the output of said operational amplifier, and comparator means for comparing said decreased output with a DC reference voltage and energizing a current connecting network that injects current into the input of said operational amplifier.

6. A AC power supply as claimed in claim 1 in which, said phase control means including at least a phase shift generator, said phase shift generator including means for shifting the phase spacing between said input signals to a given phase difference, and said phase shift generator having means for holding the amplitude of the output of said phase shift generator to a given magnitude.

7. A AC power supply as claimed in claim 6 including, a plurality of phase shift generators for shifting the phase spacing between said two AC signals from 100° increments to 1° increment and providing a single controlled phase output signal.

8. A AC power supply as claimed in claim 1 in which, said amplitude means including an amplifier responsive to input information signals for providing a given selected amplitude to the output signal supplied to the load, means for sensing the amplitude of said output signals supplied to the load and providing an error signal, and modulator means for amplitude modulating the output of said amplifier with said error signal and holding the amplitude of the output signal to the load to the amplitude of the input information signals.

9. A AC power supply as claimed in claim 8 in which, said sensing means including a feedback loop with a connecting isolation transformer for transferring the load amplitude signal to a sensing circuit, said sensing circuit including a second amplifier responsive to the input information signals and said load amplitude signal that provides an output in inverse correspondence with the input information signals, and comparator means for comparing said output to a given voltage reference and providing an error signal corresponding to amplitude error between the sensed load amplitude signal and the amplitude.

10. A AC power supply as claimed in claim 9 in which, said modulator means comprises an amplifier for amplifying the output of said amplifier, and means responsive to said error signal, for varying the input current to said amplifier, thereby increasing or decreasing the output of the amplifier in accordance with the input error signal.

11. A AC power supply as claimed in claim 1 including, second phase control means responsive to said AC signals for utilizing said phase difference for restructuring said AC signals into an output signal having a phase independent of frequency, and second amplitude means for setting the amplitude of said output signal independent of the phase and frequency, and said second phase control means and second amplitude means providing a given phase shift and amplitude to said AC signals to provide multiple phase output signals having the same frequency, phase and amplitude.

12. A AC power supply as claimed in claim 1 in which, said phase control means including a plurality of phase shift generating means, each of said phase shift generating means being responsive to a separate control signal for generating a separate digit of a programmed phase, and said shift generating means having means for combining said separate digits into a corresponding phase.

13. A AC power supply as claimed in claim 1 in which, said phase control means including a plurality of phase shift generating means, one of said phase shift generating means for generating phase signal outputs with a lower phase and a higher phase of a first group of equally separated phases, a second one of said phase shift generating means for generating a phase signal output between said lower and higher phases having a phase at the higher value therebetween, a third one of said phase shift generating means for generating a phase signal output between said lower and higher phases having a phase at the lower value therebetween, a fourth one of said phase shift generating means for generating a phase signal output between the upper and lower phase values, and said phase shift generating means having means for combining the separate phase outputs into a single phase output.

14. A AC power supply as claimed in claim 13 in which, said phase signal output of said fourth phase shift generating means being the most significant digit to a given base number, said upper and lower values being adjacent numbers of the given base number of the next most significant digit, and said lower phase and said higher phase being adjacent numbers of the given base number of the next most significant digit.

15. A AC power supply as claimed in claim 14 including, means for separately programming said one of said phase shift generating means, means for separately programming said second and third phase shift generating means, and means for separately programming said fourth phase shift generating means.

16. In an AC power supply for providing a controlled frequency signal with a fast response time, oscillator means having an amplifier for providing a selective frequency output signals, input means for controlling the frequency output of said oscillator, switch means responsive to said output signals for switching capacitance and resistance into the input circuit of said amplifier, and detector means for detecting the amplitude of the output signals of said oscillator means and injecting current into the input to said amplifier in response to detecting a drop in the amplitude of said output signals.

17. The method of providing an AC power supply having independently controlled frequency, phase and amplitude comprising the steps of, simultaneously generating at least two signals having the same frequency with a constant phase difference therebetween, shifting the relative phase of said two input signals, while adjusting their relative amplitude and summing the signals to provide an output signal having a constant amplitude and a selected phase irrespective of frequency, and setting the amplitude of the output signals to a given amplitude that is independent of phase and frequency.

18. In the method claimed in claim 17, the steps of, sensing the amplitude of the output signal supplied to a load relative to the amplitude and providing an error signal, and modulating said error signal with said output signal in amplitude modulation to correct errors in the output signal.

19. In the method claimed in claim 18 including the step of, sensing the amplitude of the output signal for said error signal through an isolation transformer.

* * * * *